(12) United States Patent
Petro et al.

(10) Patent No.: US 6,219,687 B1
(45) Date of Patent: *Apr. 17, 2001

(54) METHOD AND APPARATUS FOR AN N-NARY SUM/HPG GATE

(75) Inventors: Anthony M. Petro; James S. Blomgren, both of Austin, TX (US)

(73) Assignee: Intrinsity, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/150,720

(22) Filed: Sep. 10, 1998

Related U.S. Application Data

(60) Provisional application No. 60/069,250, filed on Dec. 11, 1997.

(51) Int. Cl.[7] ............................... G06F 7/50; G06F 7/00
(52) U.S. Cl. ........................................... 708/670; 708/493
(58) Field of Search ........................... 708/670, 680–685, 708/700–714

(56) References Cited

U.S. PATENT DOCUMENTS

| | | | | |
|---|---|---|---|---|
| 4,914,614 | * | 4/1990 | Yamakawa | 708/493 |
| 5,208,490 | * | 5/1993 | Yetter | 326/98 |
| 5,467,298 | * | 11/1995 | Yoshida | 708/493 |
| 5,499,203 | * | 3/1996 | Grundland | 708/710 |
| 6,003,059 | * | 12/1999 | Bechade | 708/714 |

* cited by examiner

*Primary Examiner*—Chuong Dinh Ngo
(74) *Attorney, Agent, or Firm*—Booth, & Wright, L.L.P.; Matthew J. Booth

(57) ABSTRACT

The present invention utilizes N-nary logic to implement an add function and a carry-lookahead function within the same gate, producing an N-nary sum and an N-nary HPG indicator.

21 Claims, 7 Drawing Sheets

METHOD AND APPARATUS FOR AN N-NARY SUM/HPG GATE

This application claims the benefits of the earlier filed U.S. Provisional Application Ser. No. 60/069,250, filed Dec. 11, 1997, which is incorporated by reference for all purposes into this application.

BACKGROUND OF THE INVENTION

1. Field of the Invention

The present invention relates to digital computing, and more particularly to an apparatus and method for implementing carry-look-ahead logic in an N-NARY adder gate.

2. Description of the Related Art

Traditional Binary Addition

In most computer systems, addition and subtraction of numbers is supported. In systems using traditional binary logic, the truth table for one-bit addition is set forth in Table 1.

TABLE 1

| A | B | A + B |
|---|---|-------|
| 0 | 0 | 0 |
| 0 | 1 | 1 |
| 1 | 0 | 1 |
| 1 | 1 | 0* |

In the last row of Table 1, a carry condition occurs. That is, the result is 0, but a carry into the next-higher-order bit position, corresponding to a decimal value of 2, has conceptually occurred.

In addition to single bits, the addition operation may be performed on multiple bits, including addition of two two-bit values. The truth table for such an operation is set forth in Table 2, where the first operand A is a two-bit value comprising bits $A_0$ and $A_1$. The second operand, B, is a two-bit value comprising bits $B_0$ and $B_1$.

TABLE 2

| $A_1$ | $A_0$ | $B_1$ | $B_0$ | A = Decimal Value | B = Decimal Value | A + B | A + B = Dec. Value |
|---|---|---|---|---|---|---|---|
| 0 | 0 | 0 | 0 | 0 | 0 | 00 | 0 |
| 0 | 0 | 0 | 1 | 0 | 1 | 01 | 1 |
| 0 | 0 | 1 | 0 | 0 | 2 | 10 | 2 |
| 0 | 0 | 1 | 1 | 0 | 3 | 11 | 3 |
| 0 | 1 | 0 | 0 | 1 | 0 | 01 | 1 |
| 0 | 1 | 0 | 1 | 1 | 1 | 10 | 2 |
| 0 | 1 | 1 | 0 | 1 | 2 | 11 | 3 |
| 0 | 1 | 1 | 1 | 1 | 3 | 00* | 0 |
| 1 | 0 | 0 | 0 | 2 | 0 | 10 | 2 |
| 1 | 0 | 0 | 1 | 2 | 1 | 11 | 3 |
| 1 | 0 | 1 | 0 | 2 | 2 | 00* | 0 |
| 1 | 0 | 1 | 1 | 2 | 3 | 01* | 1 |
| 1 | 1 | 0 | 0 | 3 | 0 | 11 | 3 |
| 1 | *1 | 0 | 1 | 3 | 1 | 00* | 0 |
| 1 | 1 | 1 | 0 | 3 | 2 | 01* | 1 |
| 1 | 1 | 1 | 1 | 3 | 3 | 10* | 2 |

Each output value in the "A+B" column of value in Table 2 indicated with an asterisk denotes a carry condition where a one has conceptually carried into the next-higher-order bit (the bit position corresponding to a decimal value of four).

N-NARY Logic

The N-NARY logic family supports a variety of signal encodings, including 1-of-4. The N-NARY logic family is described in a copending patent application, U.S. patent application Ser. No. 09/019,355, filed Feb. 5, 1998, now U.S. Pat. No. 6,066,965, and titled "Method and Apparatus for a N-NARY logic Circuit Using 1-of-4 Encoding", which is incorporated herein for all purposes and is hereinafter referred to as "The N-NARY Patent." In 1-of-4 encoding, four wires are used to indicate one of four possible values. In contrast, traditional static design uses two wires to indicate four values, as is demonstrated in Table 2. In Table 2, the $A_0$ and $A_1$ wires are used to indicate the four possible values for operand A: 00, 01, 10, and 11. The two B wires are similarly used to indicate the same four possible values for operand B. "Traditional" dual-rail dynamic logic also uses four wires to represent two bits, but the dual-rail scheme always requires two wires to be asserted. In contrast, N-NARY logic only requires assertion of one wire. The benefits of N-NARY logic over dual-rail logic, such as reduced power and reduced noise, should be apparent from a reading of The N-NARY Patent.

All signals in N-NARY logic, including 1-of-4, are of the 1-of-N form where N is any integer greater than one. A 1-of-4 signal requires four wires to encode four values (0–3 inclusive), or the equivalent of two bits of information. More than one wire will never be asserted for a 1-of-N signal. Similarly, N-NARY logic requires that a high voltage be asserted for all values, even 0. As illustrated in this specification and more thoroughly discussed in the N-NARY Patent, a 1 of N signal is used to convey multiple values of information in an integrated circuit. The 1 of N signal can convey information to and from an N-NARY logic circuit where an N-NARY logic circuit comprises a shared logic tree circuit that evaluates one or more 1 of N input signals and produces a 1 of N output signal. A single 1 of N signal comprises a bundle of N wires routed together between different cells (or different logic circuits) within a semiconductor device. A 1 of N signal uses a 1 of N encoding to indicate multiple values of information conveyed by the bundle of wires of the 1 of N signal where at most one and only one wire of the bundle of wires of the 1 of N signal is true during an evaluation cycle. The present invention further provides that the bundle of N wires may comprise a number of wires from the following group: a bundle of 3 wires, a bundle of 4 wires, a bundle of 8 wires, or a bundle of N wires. Additionally, the present invention may comprise a not valid value where zero wires of the bundle of N wires is active. Further, the present invention provides that the 1 of N encoding on the bundle of N wires cooperatively operate to reduce the power consumption in the integrated circuit according to the number of wires in the bundle of N wires evaluating per bit of encoded information.

Any one N-NARY gate may comprise multiple inputs and/or outputs. In such a case, a variety of different N-NARY encodings may be employed. For instance, consider a gate that comprises two inputs and two outputs, where the inputs are a 1-of-4 signal and a 1-of-2 signal and the outputs comprise a 1-of-4 signal and a 1-of-3 signal. Various variables, including P, Q, R, and S, may be used to describe the encoding for these inputs and outputs. One may say that one input comprises 1-of-P encoding and the other comprises 1-of-Q encoding, wherein P equals two and Q equals four. Similarly, the variables R and S may be used to describe the outputs. One might say that one output comprises 1-of-R encoding and the other output comprises 1-of-S encoding, wherein R equals four and S equals 3. Through the use of these, and other, additional variables, it is possible to describe multiple N-NARY signals that comprise a variety of different encodings.

SUMMARY OF THE INVENTION

The present invention discloses an apparatus and method for adding two 1-of-4 inputs to produce a 1-of-4 sum, and also for performing carry propagate logic on the two inputs to produce a 1-of-3 Halt-Propagate-Generate (HPG) indicator. In an alternative embodiment, the HPG indicator is a 1-of-2 signal wherein the Halt and Propagate signals are combined.

N-NARY logic in detail, in order not to obscure the present invention.

A truth table demonstrating the add operation using 1-of-4 encoding is set forth in Table 3. Each of the inputs A and B in Table 3 is a two-bit input that can represent one of four values, 0 through 3 inclusive, depending on which of the four wires for each signal is set high. Table 3 discards any potential input value that includes more than one wire asserted for each 1-of-4 signal, such as 1111 and 0101. Such values are undefined for the evaluate stage of 1-of-4 logic gates. The four wires for the two-bit sum of the 1-of-4 addition operation in Table 3 are labeled $S_3$, $S_2$, $S_1$, and $S_0$.

TABLE 3

| $A_3$ | $A_2$ | $A_1$ | $A_0$ | A Dec. Value | $B_3$ | $B_2$ | $B_1$ | $B_0$ | B Dec. Value | $S_3$ | $S_2$ | $S_1$ | $S_0$ | Output Decimal Value |
|---|---|---|---|---|---|---|---|---|---|---|---|---|---|---|
| 0 | 0 | 0 | 1 | 0 | 0 | 0 | 0 | 1 | 0 | 0 | 0 | 0 | 1 | 0 |
| 0 | 0 | 0 | 1 | 0 | 0 | 0 | 1 | 0 | 1 | 0 | 0 | 1 | 0 | 1 |
| 0 | 0 | 0 | 1 | 0 | 0 | 1 | 0 | 0 | 2 | 0 | 1 | 0 | 0 | 2 |
| 0 | 0 | 0 | 1 | 0 | 1 | 0 | 0 | 0 | 3 | 1 | 0 | 0 | 0 | 3 |
| 0 | 0 | 1 | 0 | 1 | 0 | 0 | 0 | 1 | 0 | 0 | 0 | 1 | 0 | 1 |
| 0 | 0 | 1 | 0 | 1 | 0 | 0 | 1 | 0 | 1 | 0 | 1 | 0 | 0 | 2 |
| 0 | 0 | 1 | 0 | 1 | 0 | 1 | 0 | 0 | 2 | 1 | 0 | 0 | 0 | 3 |
| 0 | 0 | 1 | 0 | 1 | 1 | 0 | 0 | 0 | 3 | 0 | 0 | 0 | 1 | 0* |
| 0 | 1 | 0 | 0 | 2 | 0 | 0 | 0 | 1 | 0 | 0 | 1 | 0 | 0 | 2 |
| 0 | 1 | 0 | 0 | 2 | 0 | 0 | 1 | 0 | 1 | 1 | 0 | 0 | 0 | 3 |
| 0 | 1 | 0 | 0 | 2 | 0 | 1 | 0 | 0 | 2 | 0 | 0 | 0 | 1 | 0* |
| 0 | 1 | 0 | 0 | 2 | 1 | 0 | 0 | 0 | 3 | 0 | 0 | 1 | 0 | 1* |
| 1 | 0 | 0 | 0 | 3 | 0 | 0 | 0 | 1 | 0 | 1 | 0 | 0 | 0 | 3 |
| 1 | 0 | 0 | 0 | 3 | 0 | 0 | 1 | 0 | 1 | 0 | 0 | 0 | 1 | 0* |
| 1 | 0 | 0 | 0 | 3 | 0 | 1 | 0 | 0 | 2 | 0 | 0 | 1 | 0 | 1* |
| 1 | 0 | 0 | 0 | 3 | 1 | 0 | 0 | 0 | 3 | 0 | 1 | 0 | 0 | 2* |

Figure 5:
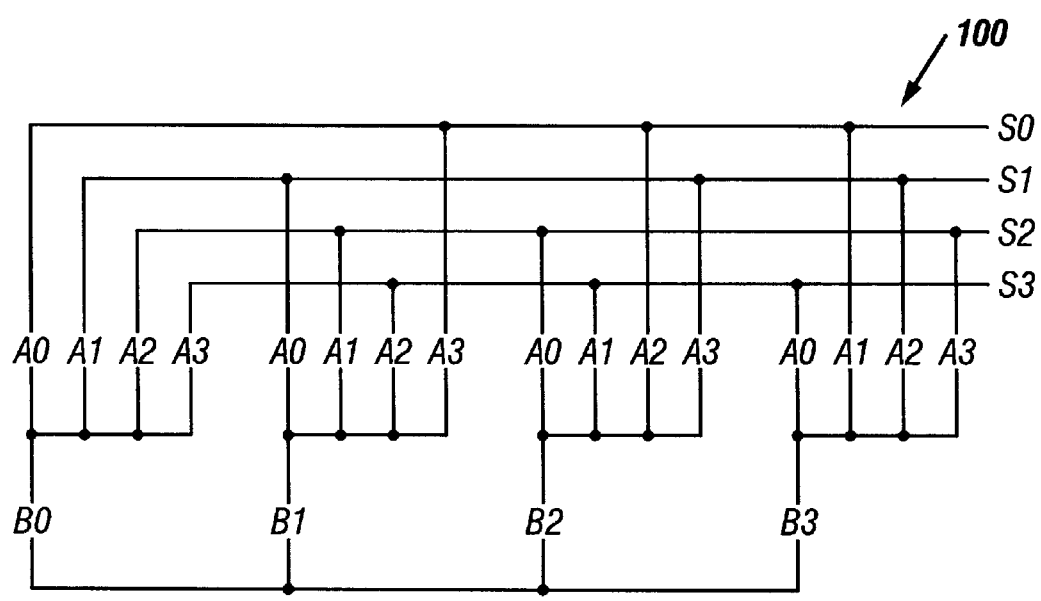

FIG. 5 is a shorthand representation of an N-NARY adder gate having two 1-of-4 addend inputs.

Figure 5A:
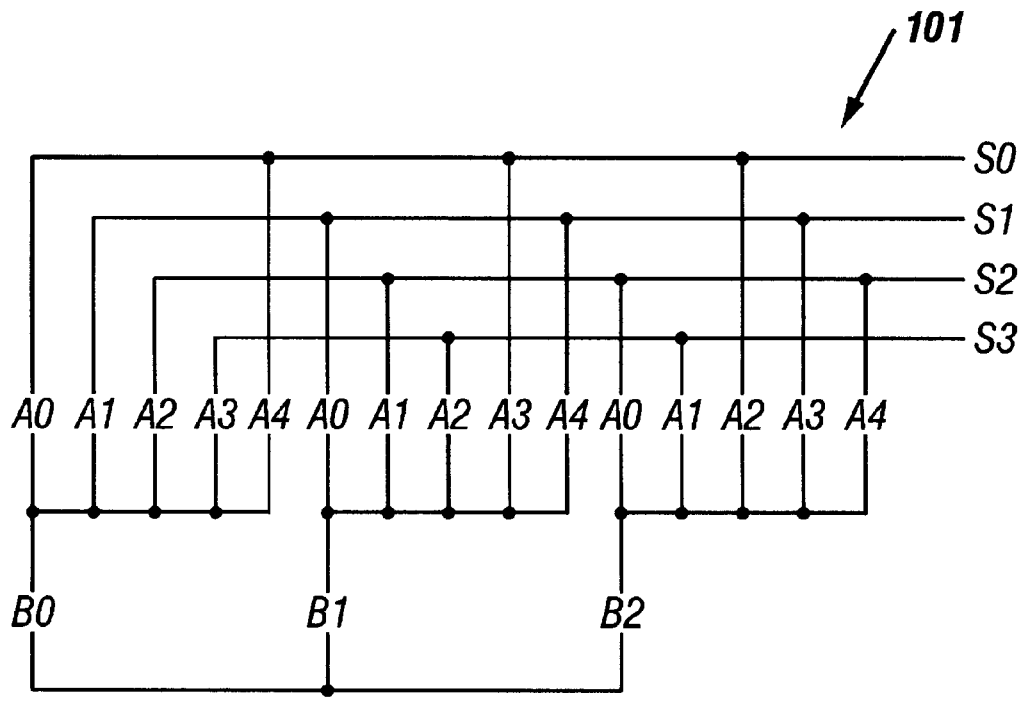

FIG. 5A is a shorthand representation of an N-NARY adder gate having a 1-of-3 addend input and a 1-of-5 addend input.

Figure 6:
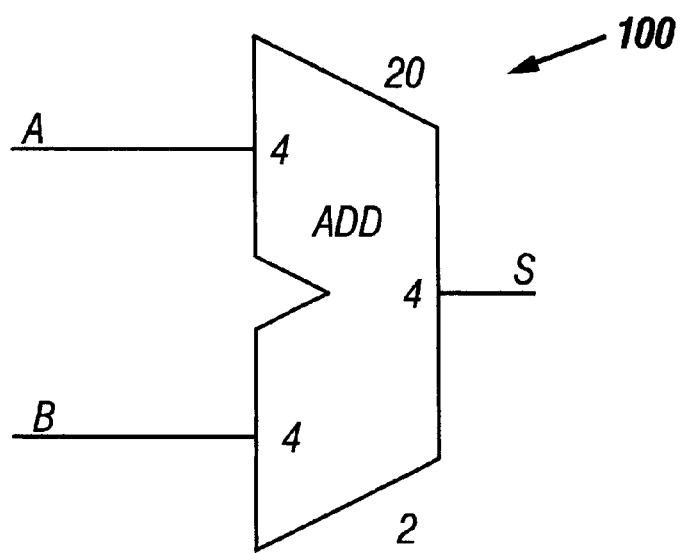

FIG. 6 is a high-level shorthand representation of an N-NARY adder gate.

Figure 7:
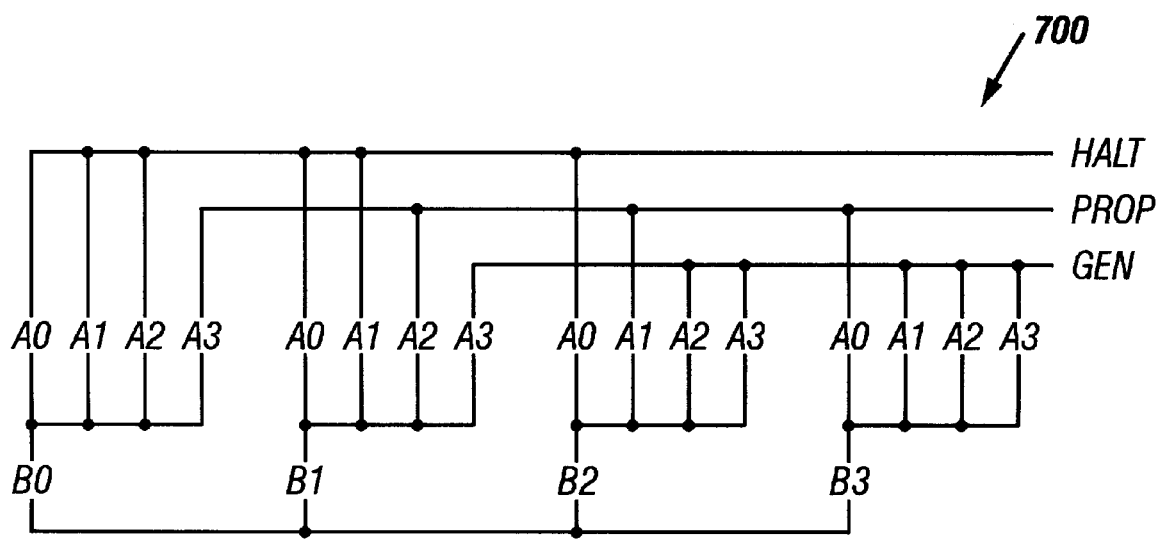

FIG. 7 is a shorthand representation of an N-NARY HPG gate having two 1-of-4 inputs.

Figure 7A:
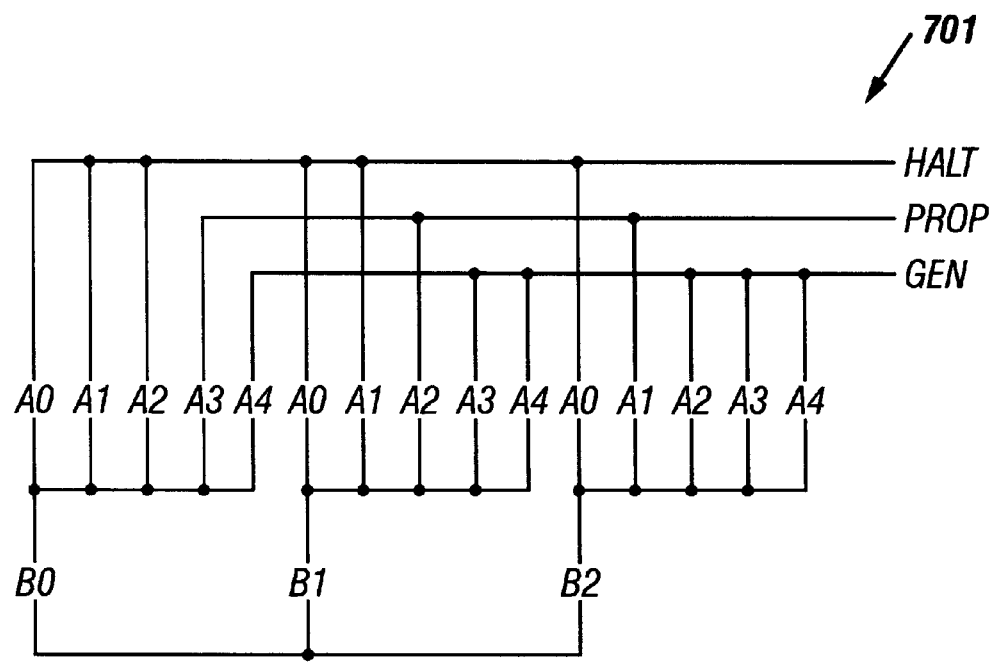

FIG. 7A is a shorthand representation of an N-NARY HPG gate having one 1-of-4 input and one 1-of-3 input.

Figure 8:
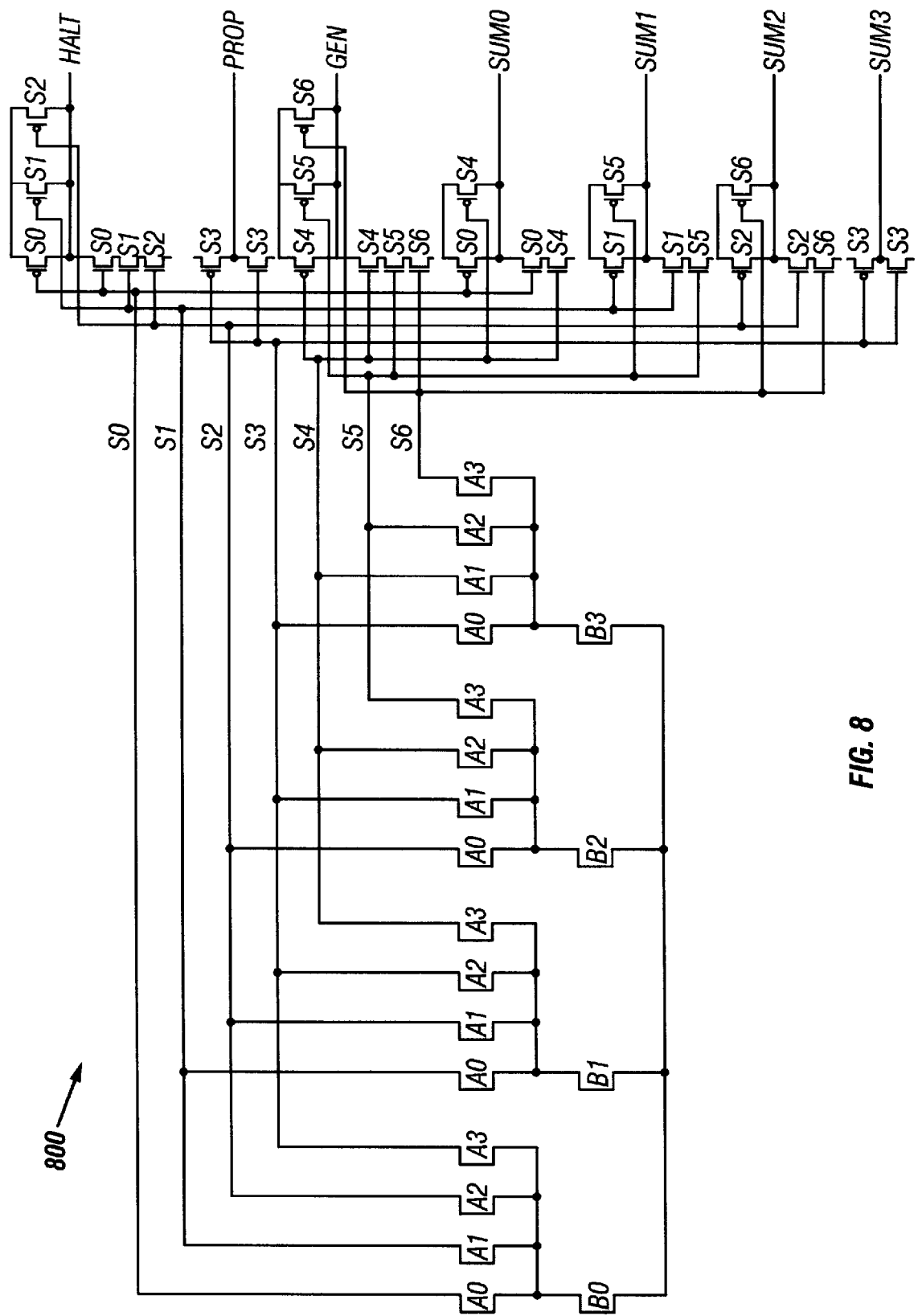

FIG. 8 is a modified shorthand representation of a sum/HPG gate having two 1-of-4 addend inputs.

Figure 8A:
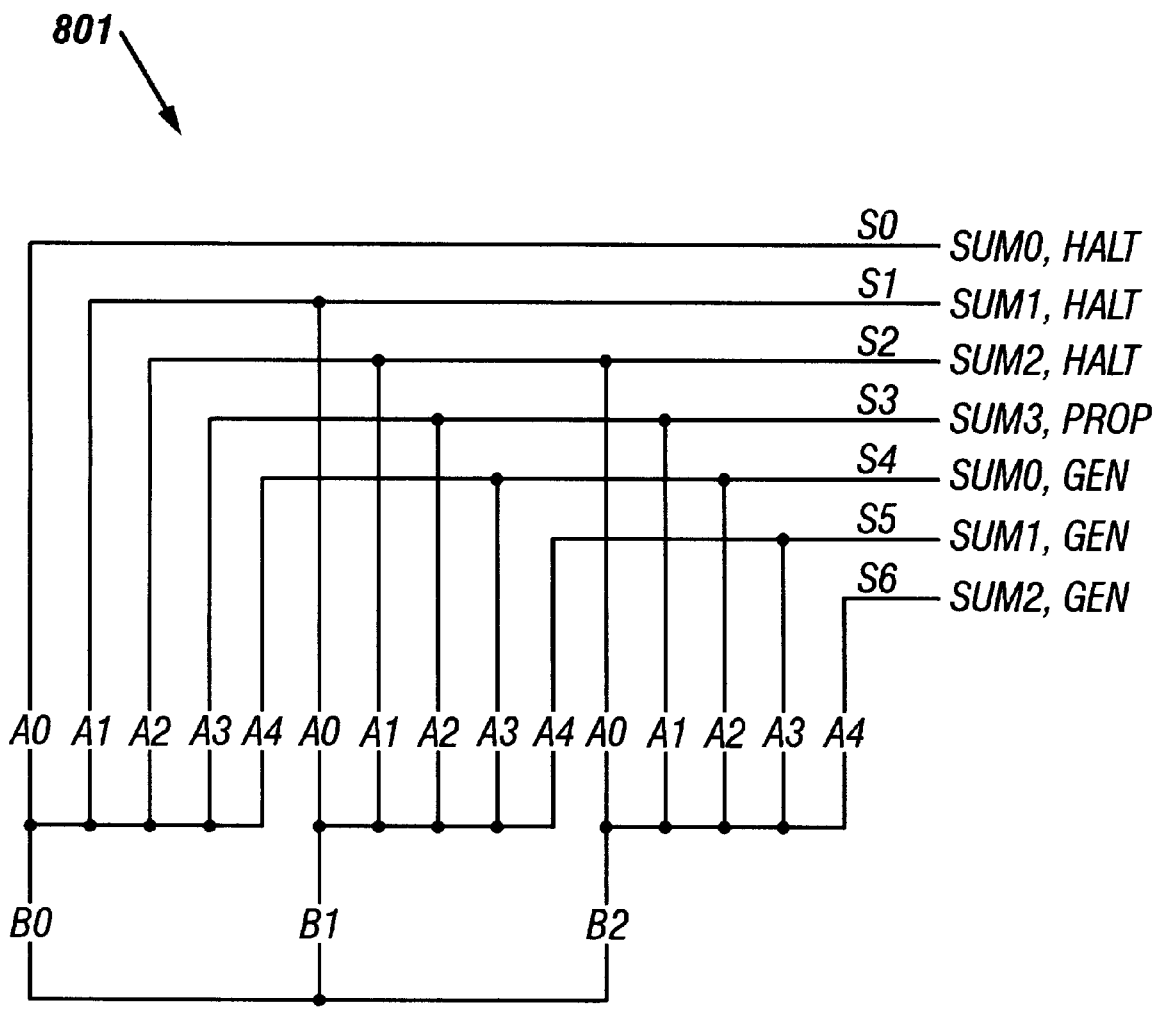

FIG. 8A is a shorthand representation of a sum/HPG gate having a 1-of-3 addend input and a 1-of-5 addend input.

DETAILED DESCRIPTION OF THE INVENTION

The present invention relates to a logic gate that adds two addends to produce both a sum and a carry propagate indicator using N-NARY logic. This disclosure describes numerous specific details that include specific formats, structures, circuits, and logic functions in order to provide a thorough understanding of the present invention. One skilled in the art will appreciate that one may practice the present invention without these specific details. Additionally, this disclosure does not describe in detail some well-known structures such as N-FETs, P-FETs, nor does it describe In Table 3, output values with asterisks indicate that a carry is conceptually generated into a higher-order bit representing a decimal value of 4.

N-NARY Logic Circuits

Figure 1:
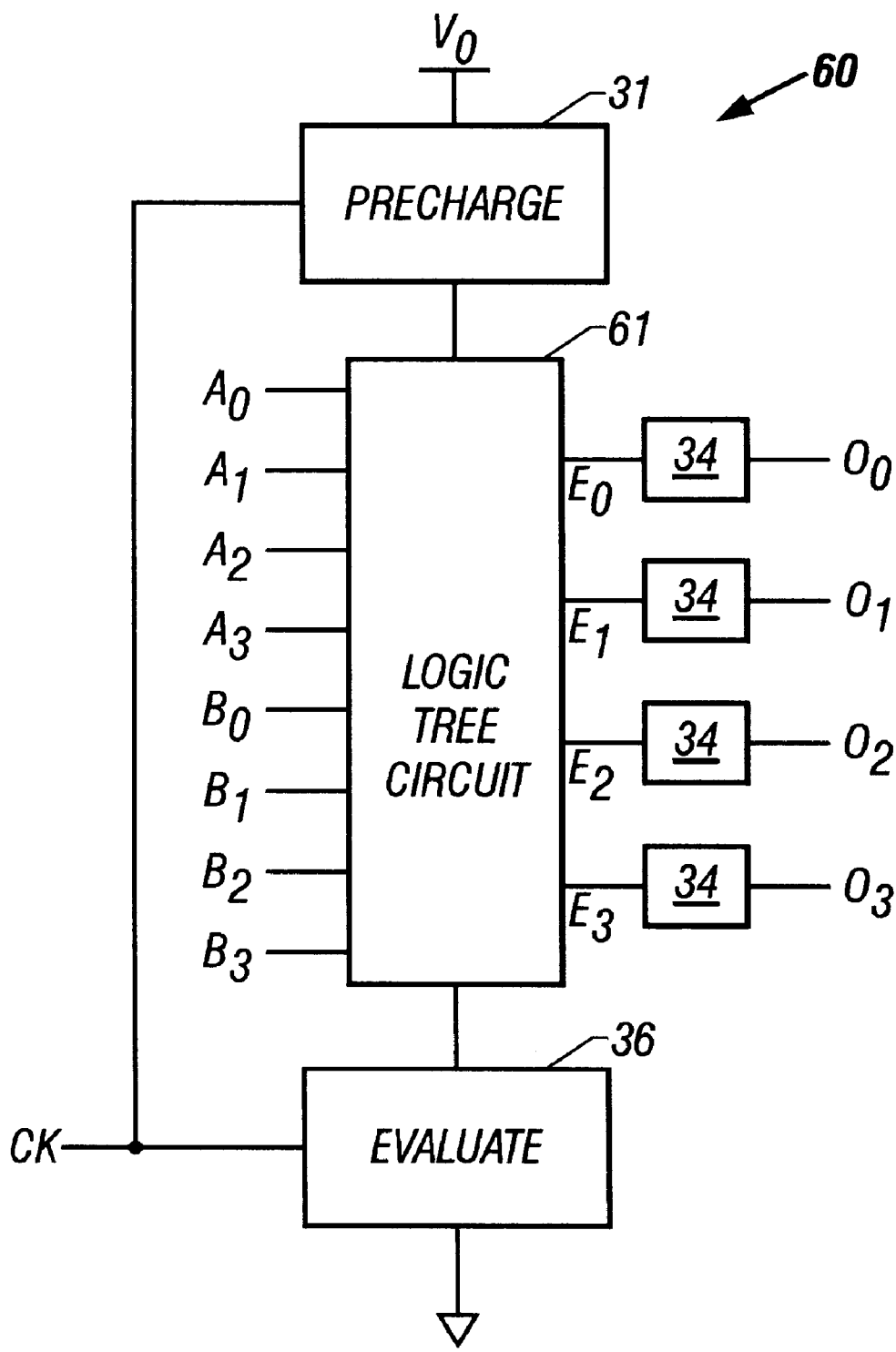
FIG. 1 is a block diagram of an N-NARY gate.

N-NARY logic may be used to create circuits to perform a desired function. The present invention utilizes N-NARY logic in the preferred embodiment of a combined Sum/HPG adder gate. A background discussion of N-NARY circuits is in order before discussing the Sum/HPG adder gate of the present invention. FIG. 1 illustrates a 1-of-N logic gate 60 that uses two sets of 1-of-N signals for the inputs and produces one 1-of-N signal for the output. In gate 60, the A and B inputs comprise four wires each, with each set of wires representing 2 bits (one dit) of data. A is a one-dit input, B is a one-dit input, and O is a one-dit output. In other words, the N-NARY gate 60 depicted in FIG. 1 comprises 4 input bits (2 dits) and 2 output bits (one dit).

Figure 2:
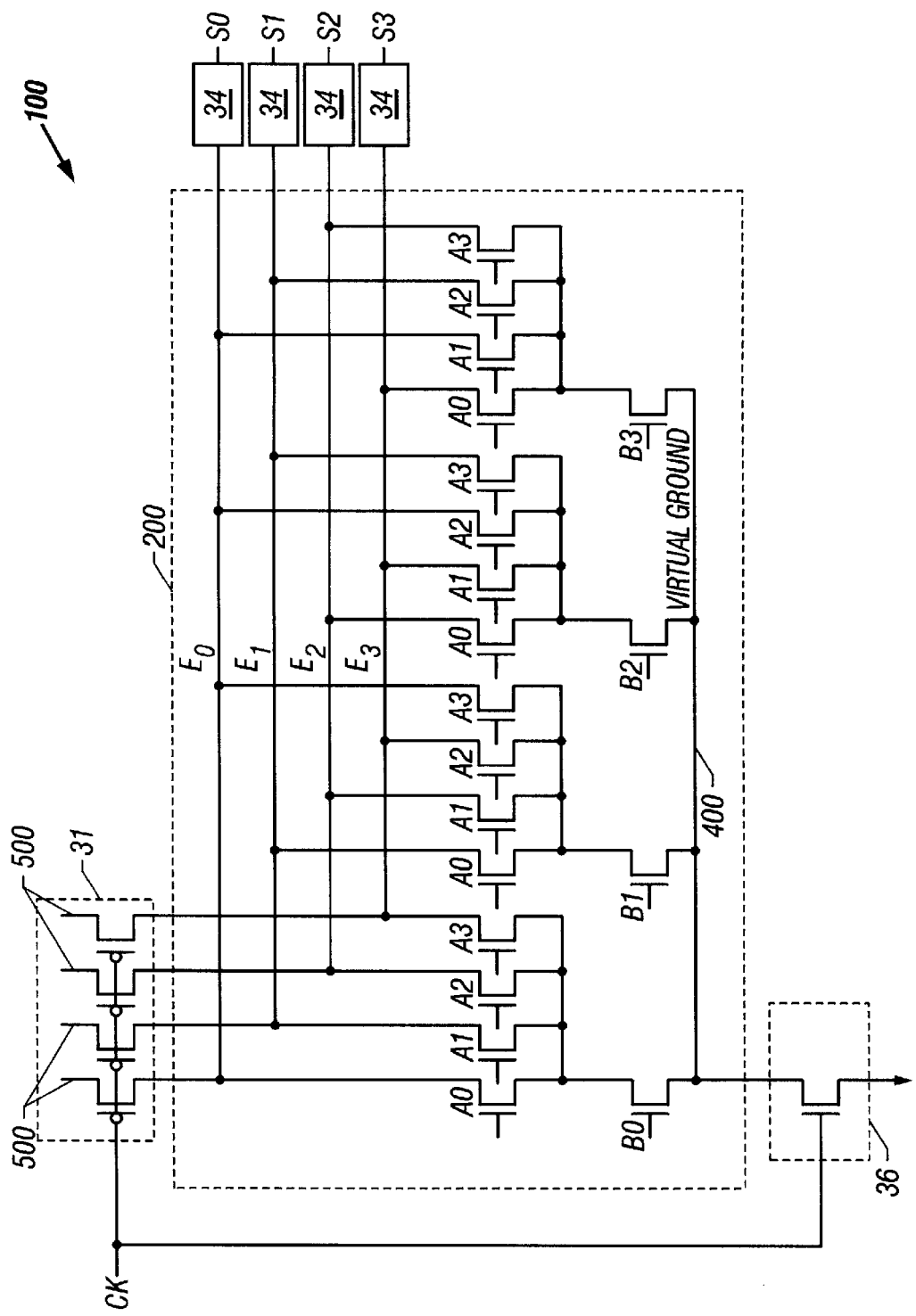
FIG. 2 is an illustration of an N-NARY adder gate.

Referring to FIG. 1, each N-NARY dit logic circuit 60 comprises a logic tree circuit 61, a precharge circuit 31, and an evaluate circuit 36. The logic tree circuit 61 performs a logic function on the two 1-of-4 input signals that could comprise a variety of functions, for example, the Boolean logic functions AND/NAND and OR/NOR, or the more complex combined add and carry-lookahead function of the present invention. The logic gates of the N-NARY family are clocked pre-charge (CP) gates. FIG. 2 illustrates that each input into the logic tree circuit 61 is coupled to at least one N-channel field effect transistor (NFET) $A_0$–$A_3$, $B_0$–$B_3$. Referring back to FIG. 1, the logic tree circuit 61 therefore comprises one or more N-channel FETS. Coupled to the wires of the 1-of-4 output signal are the output buffers 34 that aid in driving additional circuits that couple to the output signal. The preferred embodiment of the present invention uses a circuit with an inverting function as the output buffer 34.

Referring again to FIG. 1, a precharge circuit 31 couples to the logic tree circuit 61 and precharges the dynamic logic of the logic tree circuit 61. The precharge circuit 31 comprises one or more FETs with the preferred embodiment of the circuit comprising P-channel FETs (PFETs). Each evaluation path of the logic tree circuit 61 has its own precharge PFET, shown as 500 in FIG. 2. The PFETs 500 of the precharge circuit 31 quickly and fully precharge all of the dynamic logic in the logic tree circuit 61 during the precharge phase of the clock cycle.

FIG. 2 is a diagram of a simple N-NARY adder gate. FIG. 2 illustrates that the precharge PFET 500 for an evaluation node E of an N-NARY circuit is connected to positive high voltage, Vcc, and is used to create conductive paths between the evaluation node E and Vcc. Each precharge PFET 500 is coupled to an input, the pre-charge signal. When the precharge signal for any evaluate node has a low voltage, then there is a conductive path between Vcc and the evaluation node E. Coupled to the precharge circuit 31 is the clock signal CK. A low clock signal on CK will cause the FETs in the logic tree circuit 32 to charge when using P-channel FETs in the precharge circuit 31.

An evaluate circuit 36 couples to the logic tree circuit 61 and controls the evaluation of the logic tree circuit 61. The evaluate circuit 36 comprises one or more FETs connected to the CK signal, with the preferred embodiment of the evaluate circuit comprising a single N-channel FET. The single N-FET acts as an evaluation transistor that is used to control when the gate is sensitive to inputs, helps avoid races between other devices, and prevents excessive power consumption. During the precharge phase, the evaluate circuit 36 receives a low value so that no path to Vss may exist through the NFET(s) of the logic tree circuit 61. During the evaluate phase, the evaluate circuit 36 receives a high signal so that a path to Vss through the NFET(s) of the logic tree circuit 61 may exist. Coupled to the evaluate circuit 36 is the clock signal CK. A high clock signal on CK will cause the FETs in the logic tree circuit 61 to evaluate when using N-channel FETs in the evaluate circuit 36. In other words, when the clock signal is high, the evaluate circuit 36 evaluates the logic tree circuit 61.

Figure 3:
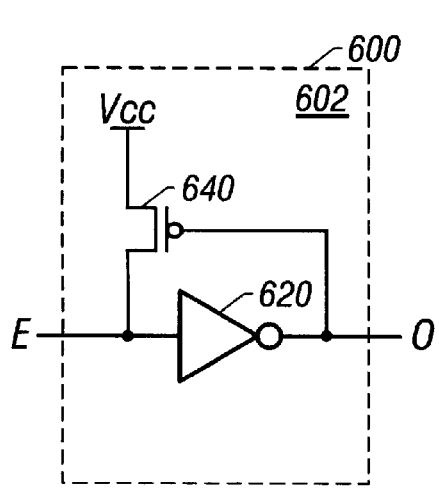
FIG. 3 is a diagram of a first embodiment of an N-NARY output driver circuit.
Figure 4:
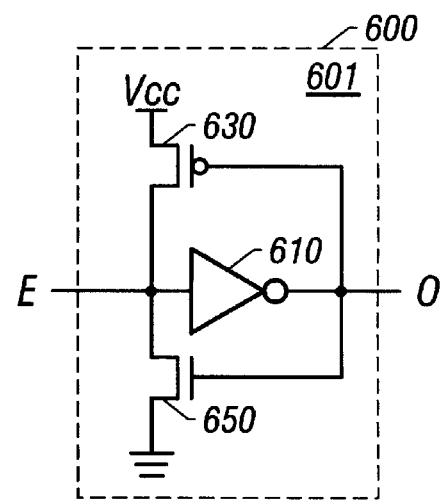
FIG. 4 is a diagram of a second embodiment of an N-NARY output driver circuit.

An evaluate node, E, which comprises the four wires $E_0$, $E_1$, $E_2$, and $E_3$, is the signal pathway between the logic tree circuit 61 and one output buffer 34, and constitutes an evaluation path of the logic tree circuit 61. As stated earlier, each evaluation node wire $E_0$, $E_1$, $E_2$, and $E_3$ has its own precharge PFET. The signal on a particular wire, $E_0$, $E_1$, $E_2$, $E_3$ of the evaluate node E is high, only when there is no connection to Vss through the logic tree circuit 61 NFET(s) associated with that particular wire. If the pre-charge signal is low at time 0, and there is no path to ground through the NFET(s) associated with an evaluate node E, of the logic tree circuit 61, then the evaluate node wire E gets pulled to a high voltage. This is called the precharge phase of the gate and we may also say that the gate is in precharge mode. If the precharge signal switches to a high voltage at a later time, the evaluate node E will be floating but the charge left on it will leave the voltage high. This is called the evaluate phase of the gate, and we may also say that the gate is in evaluate mode. If input signals generate a high voltage for any NFET(s) in the logic tree circuit 61 such that a path from the evaluate node E to ground (Vss) exists, then the charge on the evaluate node E will drain to ground, and the evaluate voltage will drop to Vss. If no such path exists, then the evaluate node E will remain at Vcc. When any gate, therefore, switches from precharge mode to evaluate mode, the evaluate node voltage is high, and it either stays high or goes low. Once the evaluate mode voltage goes low during the evaluate phase, it cannot be driven high again until the next precharge phase. Each evaluate node wire $E_0$, $E_1$, $E_2$, and $E_3$ couples to an output buffer 34. Two embodiments of the output driver circuit 600 comprising the output buffer 34 are illustrated in FIGS. 3 and 4. FIG. 3 illustrates a half keeper output driver circuit 602 that comprises an inverter 620 and a PFET device 640. FIG. 4 illustrates a full keeper output driver circuit 601 that comprises an inverter 610 coupled to a PFET device 630 and an NFET device 650. Full keeper output driver circuits 601 are only necessary for gates that can be in neither evaluate nor precharge mode for lengthy periods. The flow through the output driver circuit 600 is from evaluate node E to the output signal path O. The inverter 610, 620 of the output driver circuit 600 is necessary because the evaluate nodes of CP gates of the N-NARY logic family precharge to a high value and evaluate to a low value. The output driver circuit 600 of the output buffer 34, holds the value of an evaluate node E during an evaluate phase if the evaluate mode E has not discharged. If the evaluate mode E has discharged, then there is a path to ground holding its value low. The output of each evaluate node will switch from low to high once, at most, during an evaluate phase. The output of each evaluate node E, once coupled to an output driver circuit 600 of an output buffer 34, is therefore suitable for feeding a subsequent CP gate.

A shorthand notation for circuit diagrams can be adopted to avoid needless repetition of elements common to all N-NARY circuits. FIG. 2 illustrates these common elements. One common element is the pre-charge P-FET 500. Pre-charge P-FETs 500 are required for each evaluate node E in every 1-of-N gate since a single precharge PFET 500 would short each evaluate node E relative to the other evaluate nodes. Since all N-NARY gates require a pre-charge P-FET 500 for each evaluate node E, the pre-charge P-FETs 500 may be implied and need not be shown. The same is true for the N-FET associated with each input wire of the A and B inputs. Similarly, each evaluate node E must have its own output buffer 34, which may be implied. The N-FET associated with the evaluate node 36 may also be implied. Since these features are common to all N-NARY circuits, we may use the shorthand shown in FIG. 5 to represent the N-NARY circuits. Accordingly, FIG. 5 illustrates a shorthand notation of the adder gate depicted in FIG. 2. This shorthand notation is used in FIGS. 5, 5A, 7, 7A and 8A. In each figure, the elements discussed herein should be implied accordingly. FIG. 8 uses a modified shorthand in which the N-FET associated with each A and B input wire, and with additional logic lines, is shown. The remaining common features of N-NARY circuits, discussed above, should be implied in FIG. 8.

A further simplification to the representation of the FIG. 2 adder is shown in FIG. 6, where the inputs and outputs are shown as single signals that each can represent one of four signals and each impliedly comprises four wires. The number "4," shown within the add gate of FIG. 6, adjacent to the connections, indicates that each signal can represent one of four values. The number above the gate indicates the number of transistors in the evaluate stack, and the number below the FIG. 6 gate represents the maximum number of transistors in series between the evaluate node and virtual ground. In FIG. 6, the elements discussed herein should be implied accordingly.

Basic N-NARY Adder Gate

FIG. 5 illustrates an N-NARY adder circuit 100 that uses 1-of-4 logic to perform the addition function on two 1-of- 4inputs to generate a 1-of-4 output signal conforming to Table 3. The concepts discussed below may also be used in an adder gate that performs the add function on 1-of-3 and/or 1-of-5 addends. Such a gate 101 is depicted in FIG. 5A.

The function of the adder circuit 100 illustrated in FIG. 5 is to add two two-bit 1-of-4 inputs and produce the least significant two bits of the sum, which is also implemented as a two-bit 1-of-4 signal. Since the adder circuit 100 operates on two four-value signals it is not appropriate to refer to it as binary. The function of the adder gate 100 is quaternary, rather than binary.

The adder circuit 100 illustrated in FIG. 5 has an A input signal comprising four wires, $A_0$, $A_1$, $A_2$, and $A_3$, and a B input signal comprising four wires, $B_0$, $B_1$, $B_2$, and $B_3$. The A input signal and the B input signal can each represent any integer having a decimal value between zero and three, inclusive. Since N-NARY logic requires that only one of the four wires representing the A input be asserted at any one time, and only one of the B input wires be asserted at one time, it is convenient to treat the A and B signals as individual inputs that each can represent one of four values. The adder circuit 100 therefore has eight inputs: $A_0$, $A_1$, $A_2$, $A_3$, $B_0$, $B_1$, $B_2$, and $B_3$. If the value A is zero, then the $A_0$ wire is set high and all other A wires, $A_1$, $A_2$, $A_3$, are set low. By the same token, the $B_0$ wire corresponds to zero. Similarly, the $A_1$ wire and $B_1$ wire correspond to the decimal value of one. The $A_2$ wire and $B_2$ wire correspond to the decimal value of two. Finally, the $A_3$ wire and $B_3$ wire correspond to the decimal value of three. The adder circuit 100 illustrated in FIG. 5 performs the following logic functions:

$S_0 = B_0A_0 | B_1A_3 | B_2A_2 | B_3A_1$ (all cases that equal 0 or 4), $S_1 = B_0A_1 | B_1A_0 | B_2A_3 | B_3A_2$ (all cases that equal 1 or 5), $S_2 = B_0A_2 | B_1A_1 | B_2A_0 | B_3A_3$ (all cases that equal 2 or 6), and $S_3 = B_0A_3 | B_1A_2 | B_2A_1 | B_3A_0$ (all cases that equal 3).

The adder gate in FIG. 5 is not complete for the purposes of the present invention because it does not provide any information as to whether the sum is too large to represent in two bits of information. In other words, the FIG. 5 adder does not support the carry conditions denoted by asterisks in Table 3. What is required is an adder gate that can not only sum two one-dit numbers, but can utilize carry-propagate techniques to account for carry conditions. This is accomplished through the use of carry propagate logic, as described below.

Carry propagate logic takes carry conditions into account. For any two binary numbers A and B, the sum, $S_n$, and the carry, $C_n$, for a given bit position, n, are:

$$S_n = A_n \oplus B_n \oplus C_{n-1} \quad (1)$$

where $C_{-1}$ is the carry in from the previous bit, n−1

$$C_n = A_nB_n | A_nC_{n-1} | B_nC_{n-1} \quad (2)$$

where $C_n$ is the carry out from bit n.

The truth tables for Equation 1 and Equation 2 are set forth in Table 4.

TABLE 4

| $A_n$ | $B_n$ | $C_{n-1}$ | $A_nB_n$ (1) | $A_nC_{n-1}$ (2) | $B_nC_{n-1}$ (3) | $A_n \oplus B_n$ (4) | $S_n$ = (4) $\oplus C_{n-1}$ | $C_n$ = (1)/(2)/(3) |
|---|---|---|---|---|---|---|---|---|
| 0 | 0 | 0 | 0 | 0 | 0 | 0 | 0 | 0 |
| 0 | 0 | 1 | 0 | 0 | 0 | 0 | 1 | 0 |
| 0 | 1 | 0 | 0 | 0 | 0 | 1 | 1 | 0 |
| 0 | 1 | 1 | 0 | 0 | 1 | 1 | 0 | 1 |

TABLE 4-continued

| $A_n$ | $B_n$ | $C_{n-1}$ | $A_nB_n$ (1) | $A_nC_{n-1}$ (2) | $B_nC_{n-1}$ (3) | $A_n \oplus B_n$ (4) | $S_n$ = (4) $\oplus C_{n-1}$ | $C_n$ = (1)/(2)/(3) |
|---|---|---|---|---|---|---|---|---|
| 1 | 0 | 0 | 0 | 0 | 0 | 1 | 1 | 0 |
| 1 | 0 | 1 | 0 | 1 | 0 | 1 | 0 | 1 |
| 1 | 1 | 0 | 1 | 0 | 0 | 0 | 0 | 1 |
| 1 | 1 | 1 | 1 | 1 | 1 | 0 | 1 | 1 |

In formulating carry propagate logic, one must recognize that the critical path in any adder is along the carry chain. The most significant bit of the sum depends not only on the two most significant addend bits, but also the addend bits of every other bit position via the carry chain. Simply allowing carries to ripple from the least significant end would result in a compact but very slow adder, since the worst-case carry propagation delay would be approximately as many gate delays as the bit width of the adder.

Fast carry-propagate techniques can dramatically decrease the carry propagation delay, and therefore decrease the overall delay of the adder. Adders employing such techniques are sometimes referred to as carry-lookahead adders, or CLAs. Conventional carry propagate adder structures speed up the carry chain by computing the individual carry propagate (P) and carry generate (G) signals for each bit position.

For any two binary numbers A and B, the P and G signals for a given bit position, n, are:

$$P_n = A_n \oplus B_n \quad (3)$$

$$G_n = A_nB_n \quad (4)$$

P and G signals may also be generated for 1-of-4 numbers. G indicates that the given dit position, n, generates a carry that will have to be accounted for in the higher dits of the sum. G will be set when the sum of two 1-of-4 numbers is greater than 3. P indicates that any carry generated in lower dits will propagate across the given dit position, n, to affect the higher dits of the sum. P will be set when the sum of two 1-of-4 numbers is exactly three. If neither G nor P is true for a given dit position, then a carry halt signal (H) is implied. An H signal indicates that any carry generated in lower dits will not propagate across the given bit position, n. H will be set if the sum of two 1-of-4 numbers is less than three. Restated, if the sum of two operand dits in a given dit position is greater than 3, G is true. If the sum is exactly 3, P is true. Otherwise, H is true.

FIG. 7 illustrates an N-NARY HPG gate 700 that utilizes carry propagate logic to generate a 1-of-3 H, P, or G indication for two 1-of-4 addends. The output of the FIG. 7 gate 700 is a 1-of-3 N-NARY signal, such that one, and only one, of the H, P, or G wires is set high during a given evaluate cycle. The output of the HPG gate 700 conforms to Table 5. (A similar gate 701 may be constructed using one 1-of-3 input addend and one 1-of-5 addend input. Such a gate 701 is depicted in FIG. 7A.)

TABLE 5

| $A_3$ | $A_2$ | $A_1$ | $A_0$ | A Dec. Value | $B_3$ | $B_2$ | $B_1$ | $B_0$ | B Dec. Value | $P_n$ | $G_n$ | $H_n$ |
|---|---|---|---|---|---|---|---|---|---|---|---|---|
| 0 | 0 | 0 | 1 | 0 | 0 | 0 | 0 | 1 | 0 | 0 | 0 | 1 |
| 0 | 0 | 0 | 1 | 0 | 0 | 0 | 1 | 0 | 1 | 0 | 0 | 1 |
| 0 | 0 | 0 | 1 | 0 | 0 | 1 | 0 | 0 | 2 | 0 | 0 | 1 |
| 0 | 0 | 0 | 1 | 0 | 1 | 0 | 0 | 0 | 3 | 1 | 0 | 0 |

TABLE 5-continued

| $A_3$ | $A_2$ | $A_1$ | $A_0$ | A Dec. Value | $B_3$ | $B_2$ | $B_1$ | $B_0$ | B Dec. Value | $P_n$ | $G_n$ | $H_n$ |
|---|---|---|---|---|---|---|---|---|---|---|---|---|
| 0 | 0 | 1 | 0 | 1 | 0 | 0 | 0 | 1 | 0 | 0 | 0 | 1 |
| 0 | 0 | 1 | 0 | 1 | 0 | 0 | 1 | 0 | 1 | 0 | 0 | 1 |
| 0 | 0 | 1 | 0 | 1 | 0 | 1 | 0 | 0 | 2 | 1 | 0 | 0 |
| 0 | 0 | 1 | 0 | 1 | 1 | 0 | 0 | 0 | 3 | 0 | 1 | 0 |
| 0 | 1 | 0 | 0 | 2 | 0 | 0 | 0 | 1 | 0 | 0 | 0 | 1 |
| 0 | 1 | 0 | 0 | 2 | 0 | 0 | 1 | 0 | 1 | 1 | 0 | 0 |
| 0 | 1 | 0 | 0 | 2 | 0 | 1 | 0 | 0 | 2 | 0 | 1 | 0 |
| 0 | 1 | 0 | 0 | 2 | 1 | 0 | 0 | 0 | 3 | 0 | 1 | 0 |
| 1 | 0 | 0 | 0 | 3 | 0 | 0 | 0 | 1 | 0 | 1 | 0 | 0 |
| 1 | 0 | 0 | 0 | 3 | 0 | 0 | 1 | 0 | 1 | 0 | 1 | 0 |
| 1 | 0 | 0 | 0 | 3 | 0 | 1 | 0 | 0 | 2 | 0 | 1 | 0 |
| 1 | 0 | 0 | 0 | 3 | 1 | 0 | 0 | 0 | 3 | 0 | 1 | 0 |

Combined Sum/Carry Propagate Logic

The function of the HPG gate illustrated in FIG. 7 differs from that of the adder gate illustrated in FIG. 5, but the two gates share the same input terms. The present invention combines the function of the adder gate of FIG. 5 and the HPG gate of FIG. 7 to create a combined sum/HPG adder gate. The sum/HPG adder gate of the present invention combines the two functions, as illustrated in FIG. 8, to generate outputs conforming with Table 6.

TABLE 6

| $A_3$ | $A_2$ | $A_1$ | $A_0$ | A Dec. Value | $B_3$ | $B_2$ | $B_1$ | $B_0$ | B Dec. Value | Sum | H | P | G |
|---|---|---|---|---|---|---|---|---|---|---|---|---|---|
| 0 | 0 | 0 | 1 | 0 | 0 | 0 | 0 | 1 | 0 | 0 | 1 | 0 | 0 |
| 0 | 0 | 0 | 1 | 0 | 0 | 0 | 1 | 0 | 1 | 1 | 1 | 0 | 0 |
| 0 | 0 | 0 | 1 | 0 | 0 | 1 | 0 | 0 | 2 | 2 | 1 | 0 | 0 |
| 0 | 0 | 0 | 1 | 0 | 1 | 0 | 0 | 0 | 3 | 3 | 0 | 1 | 0 |
| 0 | 0 | 1 | 0 | 1 | 0 | 0 | 0 | 1 | 0 | 1 | 1 | 0 | 0 |
| 0 | 0 | 1 | 0 | 1 | 0 | 0 | 1 | 0 | 1 | 2 | 1 | 0 | 0 |
| 0 | 0 | 1 | 0 | 1 | 0 | 1 | 0 | 0 | 2 | 3 | 0 | 1 | 0 |
| 0 | 0 | 1 | 0 | 1 | 1 | 0 | 0 | 0 | 3 | 0 | 0 | 0 | 1 |
| 0 | 1 | 0 | 0 | 2 | 0 | 0 | 0 | 1 | 0 | 2 | 1 | 0 | 0 |
| 0 | 1 | 0 | 0 | 2 | 0 | 0 | 1 | 0 | 1 | 3 | 0 | 0 | 1 |
| 0 | 1 | 0 | 0 | 2 | 0 | 1 | 0 | 0 | 2 | 0 | 0 | 0 | 1 |
| 0 | 1 | 0 | 0 | 2 | 1 | 0 | 0 | 0 | 3 | 1 | 0 | 0 | 1 |
| 1 | 0 | 0 | 0 | 3 | 0 | 0 | 0 | 1 | 0 | 3 | 0 | 1 | 0 |
| 1 | 0 | 0 | 0 | 3 | 0 | 0 | 1 | 0 | 1 | 0 | 0 | 0 | 1 |
| 1 | 0 | 0 | 0 | 3 | 0 | 1 | 0 | 0 | 2 | 1 | 0 | 0 | 1 |
| 1 | 0 | 0 | 0 | 3 | 1 | 0 | 0 | 0 | 3 | 2 | 0 | 0 | 1 |

The function of the sum/HPG adder gate illustrated in FIG. 8 is to add two two-bit 1-of-4 inputs and generate the sum and the H, P, and G values set forth in Table 6. The two operands A and B are two-bit 1-of-4 values, as is the sum S. The H, P, and G outputs represent the three wires for a 1-of-3 output. A similar gate 801 may be constructed using a 1-of-3 addend input and a 1-of-5 addend input. Such a gate 801 is depicted in FIG. 8A.

FIG. 8 illustrates that it is not necessary to construct multiple identical output signals from an evaluate node, even though the sum/HPG adder gate illustrated in FIG. 8 comprises two output signals. In FIG. 8, the evaluate nodes are identified as S0, S1, S2, S3, S4, S5, and S6. In order for the two different output signals to conform to the 1-of-N signal definition, additional processing is performed on the evaluate nodes. In this processing, each evaluate node S0–S6 drives more than one output, and the outputs are different. FIG. 8 illustrates that for the HALT output, the S0, S1, and S2 evaluate nodes are NAND'ed together. The PROP output is pulled high if the S3 evaluate node is asserted. For the GEN output, the S4, S5, and S6 evaluate nodes are NAND'ed together. The Sum0 output is pulled high if the S0 or S4 evaluate nodes are asserted. For Sum1, the S1 and S5 evaluate nodes are NAND'ed together. For Sum2, the S2 and S6 evaluate nodes are NAND'ed together. Finally, the Sum3 output is pulled high if the S3 evaluate node is asserted. Because the evaluate nodes are asserted low and the outputs are asserted high, the effect of NAND'ing is to logically OR the evaluate terms.

In sum, the present invention utilizes N-NARY logic to implement an add function and a carry-lookahead function within the same gate. In the preferred embodiment, the inputs into the gate are two two-bit 1-of-4 addends. The outputs of the preferred embodiment of the gate are a 1-of-4 sum, representing the least significant dit of the sum of the two addends, and a 1-of-3 HPG indicator, which indicates whether a carry into the dit will halt, a carry into the dit will propagate, or a carry out will be generated.

Other embodiments of the invention will be apparent to those skilled in the art after considering this specification or practicing the disclosed invention. The specification and examples above are exemplary only, with the true scope of the invention being indicated by the following claims.

What is claimed is:

1. A sum/HPG adder that adds two N-NARY addends that comprise 1 of N signals to produce an N-NARY sum that comprises a 1 of N signal and an N-NARY HPG indicator that comprises a 1 of N signal, comprising:

a 1-of-P first addend input configured to receive the first addend wherein said 1 of P first addend input comprises a 1 of N signal where N is greater than 2;

a 1-of-Q second addend input configured to receive the second addend wherein said 1 of Q second addend input comprises a 1 of N signal where N is greater than 2;

a sum/HPG circuit that adds the first and second addends to produce the sum and that performs carry propagate logic to produce the HPG indicator; and said sum/HPG circuit is coupled to said first addend input and said second addend input, said sum/HPG circuit is further coupled to a 1-of-R sum output that is configured to produce the sum wherein said 1 of R sum output comprises a 1 of N signal where N is greater than 2, and said sum/HPG circuit is further coupled to a 1-of-S HPG output that is configured to produce the HPG indicator wherein said 1 of S HPG output comprises a 1 of N signal where N is greater than 2.

2. The apparatus of claim 1 wherein said 1-of-S HPG output comprises a 1 of N signal where N=3.

3. The apparatus of claim 1 wherein said 1-of-P first addend input comprises a 1 of N signal where N=3, 4, or 5.

4. The apparatus of claim 1 wherein said 1-of-Q second addend input comprises a 1 of N signal where N=3, 4, or 5.

5. The apparatus of claim 1 wherein said 1-of-R sum output comprises a 1 of N signal where N=3, 4, or 5.

6. A system for adding and performing carry-look-ahead logic on two N-NARY addends that comprise 1 of N signals to produce an N-NARY sum that comprises a 1 of N signal and an N-NARY HPG indicator that comprises a 1 of N signal, comprising:

a 1-of-P first addend input configured to receive the first addend wherein said 1 of P first addend input comprises a 1 of N signal where N is greater than 2;

a 1-of-Q second addend input configured to receive the second addend wherein said 1 of Q second addend input comprises a 1 of N signal where N is greater than 2;

a 1-of-R sum output for delivering the sum wherein said 1 of R result output comprises a 1 of N signal where N is greater than 2;

a 1-of-S HPG output for delivering the HPG indicator wherein said 1 of S HPG output comprises a 1 of N signal where N is greater than 2; and a circuit means, coupled to said first addend input, said second addend input, said sum output means, and said HPG output, said circuit means comprising an adding means for adding the first addend and the second addend to produce the sum, said circuit means further comprising an HPG means for performing carry propagate logic to produce the HPG indicator.

7. The system of claim 6 wherein said 1-of-S HPG output comprises a 1 of N signal where N=3.

8. The system of claim 6 wherein said 1-of-P first addend input comprises a 1 of N signal where N=3, 4, or 5.

9. The system of claim 6 wherein said 1-of-Q second addend input comprises a 1 of N signal where N=3, 4, or 5.

10. The system of claim 6 wherein said 1-of-R sum output comprises a 1 of N signal where N=3, 4, or 5.

11. A method to manufacture an apparatus that adds and performs carry-look-ahead logic on two N-NARY addends that comprise 1 of N signals to produce an N-NARY sum that comprises a 1 of N signal and an N-NARY HPG indicator that comprises a 1 of N signal, comprising:

providing a 1-of-P first addend input that is coupled to receive the first addend wherein said 1 of P first addend input comprises a 1 of N signal where N is greater than 2;

providing a 1-of-Q second addend input that is coupled to receive the second addend wherein said 1 of Q second addend input comprises a 1 of N signal where N is greater than 2;

providing a sum/HPG circuit that adds the addends to produce the sum and that performs carry propagate logic to produce the HPG indicator;

coupling said sum/HPG circuit to said first addend input and said second addend input;

providing a 1-of-R sum output that is configured to deliver the sum wherein said 1 of R result output comprises a 1 of N signal where N is greater than 2;

providing a 1-of-S HPG output that is coupled to deliver the HPG indicator wherein said 1 of S HPG output comprises a 1 of N signal where N is greater than 2; and further coupling said sum/HPG circuit to said sum output and to said HPG output.

12. The apparatus of claim 11 wherein said 1-of-S HPG output comprises a 1 of N signal where N=3.

13. The apparatus of claim 11 wherein said 1-of-P first addend comprises a 1 of N signal where N=3, 4, or 5.

14. The apparatus of claim 11 wherein said 1-of-Q second addend comprises a 1 of N signal where N=3, 4, or 5.

15. The apparatus of claim 11 wherein said 1-of-R sum output comprises a 1 of N signal where N=3, 4, or 5.

16. A method for adding two N-NARY addends that comprise 1 of N signals to produce an N-NARY sum that comprises a 1 of N signal and N-NARY HPG signal that comprises a 1 of N signal, comprising:

receiving the first addend on a 1-of-P first addend input wherein said 1 of P first addend input comprises a 1 of N signal where N is greater than 2;

receiving the second addend on a 1-of-Q second addend input wherein said 1 of Q second addend input comprises a 1 of N signal where N is greater than 2;

adding the first addend and the second addend to produce the sum;

producing the sum on a 1-of-R sum output wherein said 1 of R sum output comprises a 1 of N signal where N is greater than 2;

performing carry propagate logic on the first addend and the second addend to produce the HPG indicator; and producing the HPG indicator on a 1-of-S HPG output wherein said 1 of S HPG output comprises a 1 of N signal where N is greater than 2.

17. The method of claim 16 wherein said 1-of-S HPG output comprises a 1 of N signal where N=3.

18. The method of claim 16 wherein said 1-of-P first addend input comprises a 1 of N signal where N=3, 4, or 5.

19. The method of claim 16 wherein said 1-of-Q second addend input comprises a 1 of N signal where N=3, 4, or 5.

20. The method of claim 16 wherein said 1-of-R sum output comprises a 1 of N signal where N=3, 4, or 5.

21. The method of claim 16 wherein said step of performing carry propagate logic further comprises:

setting the HPG indicator to indicate that a carry will not propagate and that a carry will not be generated if the sum of adding the first addend to the second addend produces a value less than or equal to $\{((P+Q) \div 2) - 2\}$;

setting the HPG indicator to indicate that a carry will propagate if the sum of adding the first addend to the second addend produces a value of $\{((P+Q) \div 2) - 1\}$; and setting the HPG indicator to indicate that a carry will be generated if the sum of adding the first addend to the second addend produces a value greater than $\{((P+Q) \div 2) - 1\}$.

* * * * *